United States Patent [19]

Toriyama et al.

[11] Patent Number: 4,672,524
[45] Date of Patent: Jun. 9, 1987

[54] OVERCURRENT AND OVERVOLTAGE PROTECTED TRANSISTOR INVERTER

[75] Inventors: Minoru Toriyama; Hideaki Kunisada; Katsuo Sato, all of Hitachi, Japan

[73] Assignees: Hitachi, Ltd., Tokyo; Hitachi Engineering Co., Ltd., Hitachi, both of Japan

[21] Appl. No.: 903,198

[22] Filed: Sep. 3, 1986

[30] Foreign Application Priority Data

Sep. 3, 1985 [JP] Japan .................. 60-193170

[51] Int. Cl.[4] .......................................... H02H 7/122
[52] U.S. Cl. ..................................... 363/56; 307/263; 363/98; 363/132
[58] Field of Search ............. 363/17, 56, 98, 132; 361/111; 307/263

[56] References Cited

U.S. PATENT DOCUMENTS 3,729,655  4/1973  Gratzke ......................... 363/56
4,178,619  12/1979  Seiler et al. ................... 361/111

FOREIGN PATENT DOCUMENTS 139024  10/1979  Japan ..................................... 363/98
19122   2/1981   Japan ..................................... 363/56
25174   2/1982   Japan ..................................... 363/98
172980  9/1984   Japan ..................................... 363/132

Primary Examiner—William H. Beha, Jr.
Attorney, Agent, or Firm—Fay, Sharpe, Beall, Fagan, Minnich & McKee

[57] ABSTRACT

An inverter that has one or more transistors for supplying current to a load with one or more phases is provided with an overcurrent protection for the transistor. The changing rate for reducing the base current to the transistor upon the detection of an overcurrent is reduced according to a separate delay circuit so that the transistor will not be destroyed by an over voltage that would otherwise occur due to a rapid drop in current passing through the transistor and the inductance of the load circuit including the transistor.

7 Claims, 4 Drawing Figures

OVERCURRENT AND OVERVOLTAGE PROTECTED TRANSISTOR INVERTER

FIELD OF THE INVENTION

The present invention relates to a transistor inverter. More especially, a transistor of the transistor inverter is protected from destruction due to an over voltage when an overcurrent protector for the transistor operates.

BACKGROUND OF THE INVENTION

As a switching element for an inverter, a transistor, a thyristor and a gate turn off thyristor are used. Since a transistor is superior to the others in characteristics of on and off switching operation, speed, etc. the transistor is used widely according to increasing a rated current thereof. As a transistor has not so large an overcurrent capacity, it is necessary for an overcurrent protection to be provided. For this purpose, as shown in Japan Patent Laid-Open No. 59-103567, a transistor is turned off without regard for the on or off signal being provided for the inverter operation to the transistor when an overcurrent flowing in the transistor is detected. By the system, the transistor is protected from destruction due to the overcurrent. However, there is another problem in the system. the switching speed of the transistor is very rapid, so that the transistor may receive very high voltage due to an inductance being in the circuit including the transistor. The voltage V is defined as follows:

$$V = K \cdot L \cdot (dI/dt)$$

where
K: a constant due to a construction of the circuit,
L: a inductance beng in the circuit, and
dI/dt: a differentiation in time of the current flowing the circuit.

As known from the equation, the current in the circuit is large, especially when a plurality of transistor are directly connected in parallel in order to increase a rated current of the switching element, and the voltage becomes very large. This means that the transistor may be protected from an overcurrent but it may be destroyed by the overvoltage due to an operation for overcurrent protector.

To prevent the destruction of the transistor due to the overvoltage, it is known to employ two methods. One is that the inductance in the circuit is made as small as possible. The other is that a capacitance of a capactor in a snubber circuit to suppress the surge voltage as shown by above equation is made as large as possible. However, both methods are not practical, because the inverter may be very expensive and very large in size.

SUMMARY OF THE INVENTION

In the present invention, when an overcurrent is detected, the transistor passing the overcurrent is turned off limiting the current reduction rate in time to a predetermined value. Therefore, by the present invention, a surge voltage is suppressed according to the above equation. Then, the transistor is protected from an overcurrent and an overvoltage.

It is an object of the present invention to provide a transistor inverter which is free from destruction due to an overcurrent and due to overvoltage.

It is an object of the present invention to provide a transistor inverter that is small in size.

It is an object of the present invention to provide a transistor inverter that is not expensive.

DETAILED DESCRIPTION

Figure 1:
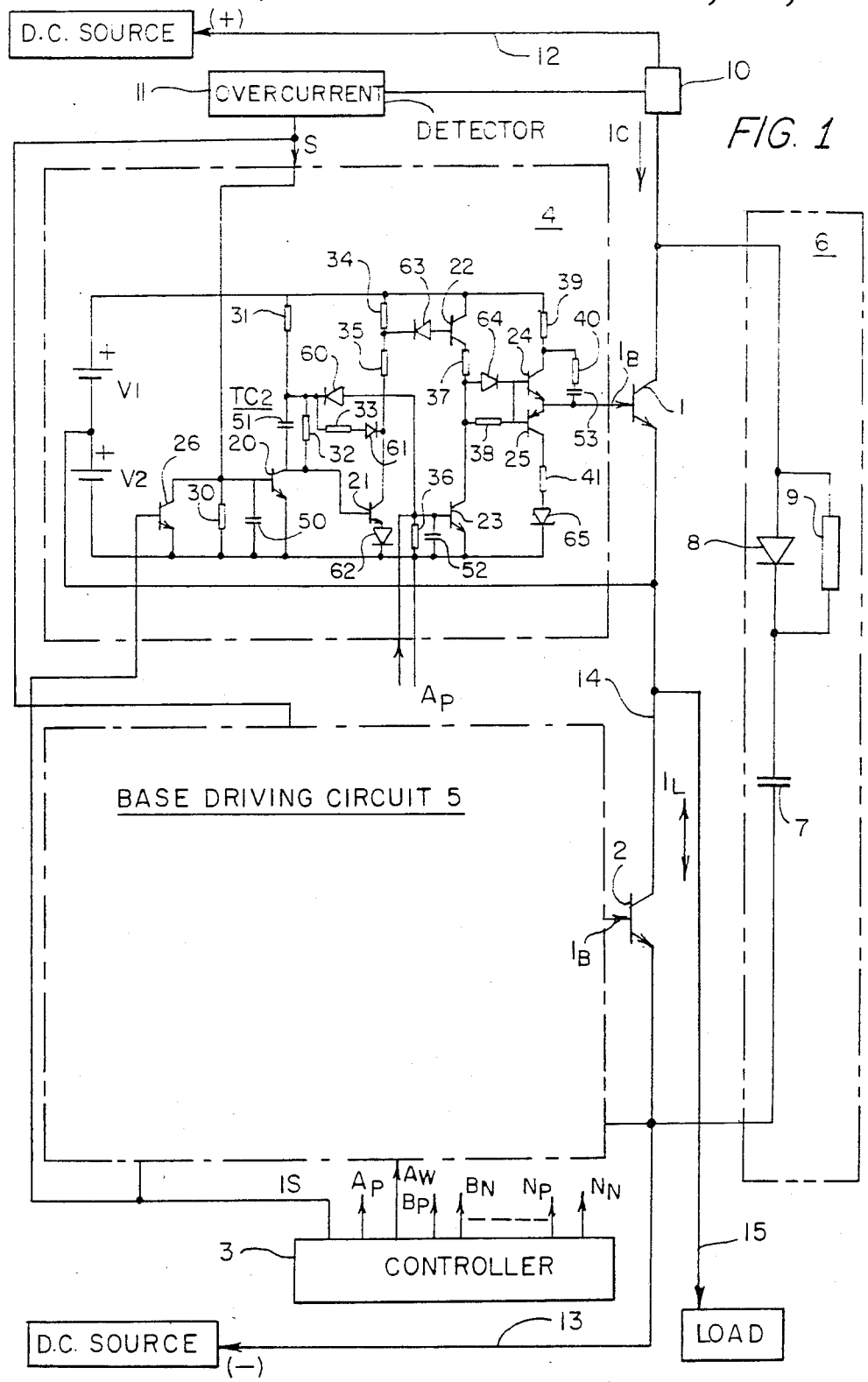
FIG. 1 shows an embodiment of the present invention.

FIG. 1 shows an embodiment of the present invention. Transistors 1 and 2 are connected in series with each other. Although the transistors are shown as single transistors, each may be replaced by a plurality of transistor connected in parallel. The collector terminal of the transistor 1 is connected to a plus terminal of a D.C. source through a lead 12. The emitter terminal of the transistor 2 is connected to a minus terminal of the D.C. source through a lead 13. A lead 14 connects between the emitter terminial of the transistor 1 and collector terminal of the transistor 2. A lead 15 connected to the lead 14 is connected to a load. A controller 3 generates base driving signals Ap, An, Bp, Bn, . . . , Np and Nn having a predetermined period in time and in order, corresponding to a number N of phase of the load and an interlock signal IS when the base driving signals are changed under a normal operation. The base driving ON signal and OFF signal as described later. When an abnormal operation of the inventer, for example, the status in which it is not a timing for changing the base driving signals and an overcurrent of the transistor 1 is detected, the controller 3 generates only the OFF signal as the base driving signals Ap, Np, Bp, Bn, . . . , Np and Nn, at the same time according to the detection and does not generate the interlock signal IS. Base driving circuits 4 and 5 are preferably identical and have two output terminals, which are connected to the base terminal and the emitter terminal of the transistors 1 and 2, respectively and are supplied the base driving signal Ap and An, respectively. The base driving circuits 4 and 5 provide a base current Ib to the base terminals of the transistors 1 and 2, respectively, when the base driving signal is the ON signal, and remove a base current Ib from the base terminals of the transistors 1 and 2, respectively, when the base driving signal is the OFF sgnal. A snubber circuit 6 has a series circuit of a capacitor 7 and a diode 8, and has a resistor 9 connected to the diode 8 in parallel. The snubber circuit is connected between the collector terminal of the transistor 1 and the emitter terminal of the transistor 2. A current detector 10 is provided in the lead 12 in order to detect a collector current IC flowing through the transistors 1 and 2. An overcurrent detector 11 is supplied an output of the current detector 10 and provides an overcurrent signal S to the base driving circuits 4 and 5 when detected current exceeds a predetermined value.

When the overcurrent signal S is provided to the base driving circuits 4 and 5, the base currents IB are reduced according to a predetermined reduction rate in order to protect the transistor 1 and 2. In this time, by the present invention, an overvoltage due to the inductances being in the leads 12, 13 and 14, is suppressed. The reduction rate of the collector current $I_C$ is limited to a small value because the base current $I_B$ reduces according to the limited reduction rate. The interlock signal IS provided by the controller 3 nullifies the overcurrent signal S.

A number of circuits, each of which comprises the transistors 1 and 2 and the base driving circuits 4 and 5 are connected in parallel, with the number of such circuits being the number N of phases of the load. The controller 3, current detector 10, the overcurrent detector 11 and the snubber circuit 6 are used commonly for all N circuits.

To further understand the present invention, the embodiment of the base driving circuit 4 is described in more detail. The reference numerals 20–26 are transistors, 30–41 are resistors, 50–53 are capacitors, 60–65 are diodes and $V_1$ and $V_2$ are auxiliary D.C. sources.

When the transistors 1 and 2 are in a steady status, under normal operation, the overcurrent signal S and the interlock signal IS are substantially zero. The transistors 20 and 25 are off and the transistors 21 and 22 are on. The collector current $I_C$ is provided to the load as a load current $I_L$.

The base terminal of the transistor 23 is supplied the base driving signal which has two levels of (1) substantially zero and (2) high.

(1) When the zero level is given to the base terminal of the transistor 23, the transistor 23 is off and the transistor 24 is on, being supplied a base current through the transistor 22. The base current $I_B$ of the transistor 1 is supplied by the circuit of the auxiliary D.C. source $V_1+$—the resistor 39—transistor 24—the base terminal of the transistor 1—the emitter terminal of the transistor 1—the auxiliary D.C. source $V_1-$. That is, the zero level of the base driving signal is the ON signal for the transistor 1.

(2) When the high level of the base driving signal is given to the base terminal of the transistor 23, the transistor 23 is on and the transistor 24 is off because the base terminal of the transistor 24 loses a high potential due to the on status of the transistor 23. The transistor 25 becomes on. Then, the base terminal of the transistor 1 is biased reversely by the circuit of the auxiliary D.C. source $V_2+$—the emitter terminal of the transistor 1—the base terminal of the transistor 1—the transistor 25—the resistor 41—the diode 65—the auxiliary D.C. source $V_2-$. That is, the high level of the base driving signal is an OFF signal for the transistor 1.

The transistors 24 and 25 have different conductivity types of NPN and PNP, respectively, and a common base potential. So, both are not on at the same time.

In the embodiment of the present invention, two time constant circuits $TC_1$ and $TC_2$ are provided. The time constant circuit $TC_1$ is formed by the series circuit of the resistor 40 and the capacitor 53, which is connected between the collector and the emitter terminal of the transistor 24. The time constant circuit $TC_2$ is formed by the parallel circuit of the resistor 32 and the capacitor 51 which is connected between the connecting point of the collector terminal of the transistor 20 and the base terminal of the transistor 21, and the resistor 31 connected to the auxiliary D.C. source $V_1+$. The time constant circuit $TC_1$ performs to limit the reduction rate of the current $I_c$ flowing through the transistor 1. When the OFF signal of the base driving signal is provided to the base terminal of the transistor 23, the high level signal rises with a time constant determined by the time constant circuit $TC_2$, because the base terminal of the transistor 23 is connected to one end of the time constant circuit $TC_2$, through the diode 60 and is connected to the other end of the time constant circuit $TC_2$ through the resistor 36 through the diode 62 and the emitter the base terminals of the transistor 21 which is on.

At the instantaneous time of applying the high OFF signal, the high level signal is substantially clamped to zero. After that the signal rises according to the time constant of the circuit $TC_2$.

When the OFF signal establishes, gradually, the transistor 23 becomes gradually on and the transistor 24 becomes gradually off. When the transistor 24 is changed to the off status from the on status, the base current $I_B$ is supplied through the circuit of the auxiliary D.C. source $V_1+$—the resistor 39—the time constant circuit $TC_1$—transistor 1—the auxiliary D.C. source $V_1-$, during the time determined by the time constant, circuit $TC_1$, although the transistor 1 has the tendency to be reversely biased by the circuit of the auxiliary D.C. source $V_2+$—the transistor 1—the transistor 25—the resistor 41—the diode 65—the auxiliary D.C. source $V_2-$. Then the base current $I_B$ is reduced gradually and the collector current $I_C$ is reduced gradually too.

This operation is performed when the overcurrent is detected.

Figure 2:
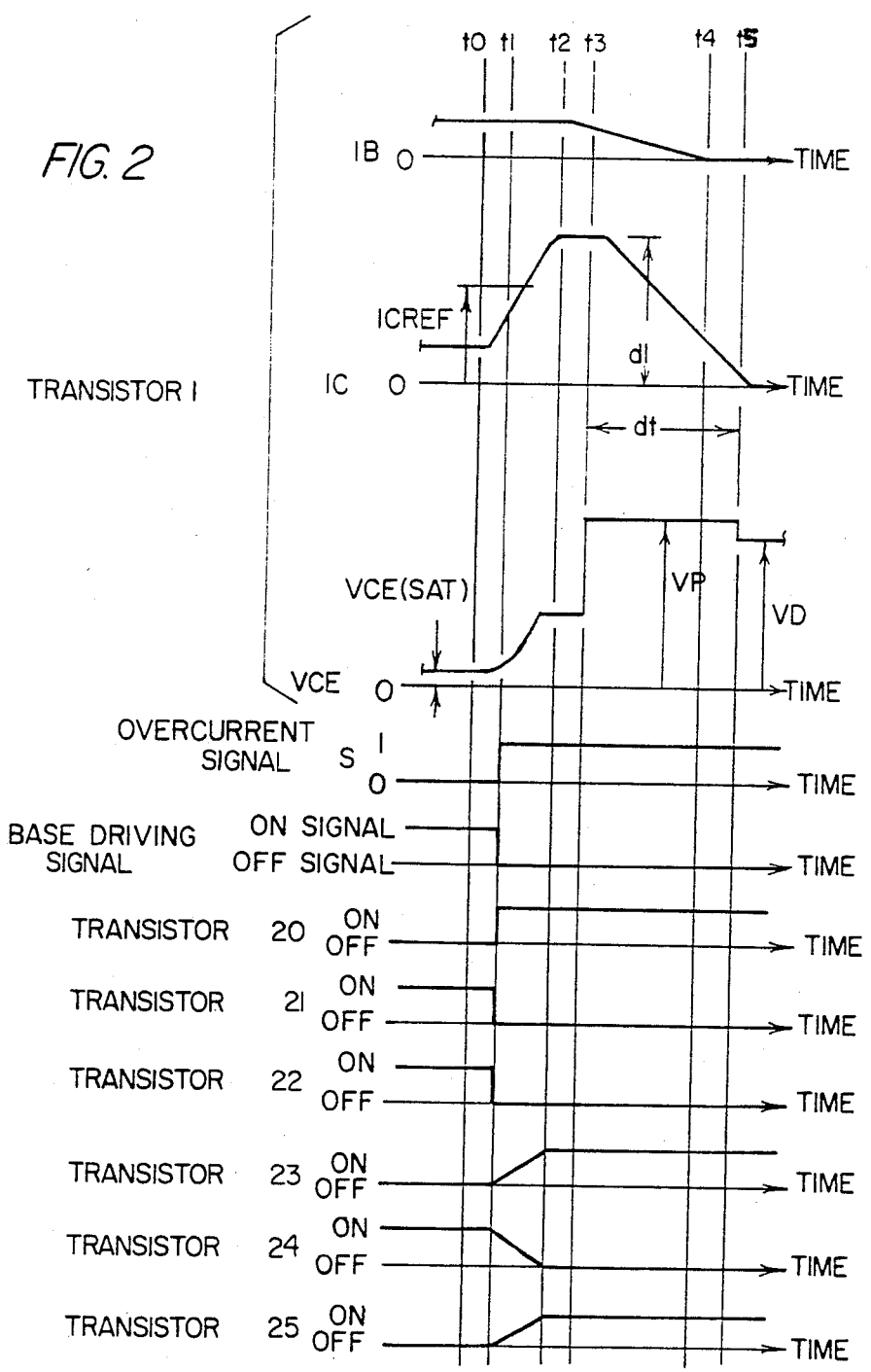
FIG. 2 shows some important wave forms of the embodiment of the present invention.

Suppose the transistor 1 is in a steady status of an on status and then the overcurrent signal S is supplied from the overcurrent detector 11, referring to FIG. 2.

In FIG. 2, at a time $t_0$, the collector current $I_C$ begins to be increased by some reason which may be a short circuit in the load. When the collector current $I_C$ exceeds a reference value $I_{Cref}$ at a time $t_1$, the overcurrent signal S is supplied to the base driving circuit 4 at the time $t_1$. Until the time $t_1$, the transistor 20 is off, the transistors 21 and 22 are on, the base driving signal is the ON signal, the transistor 23 is off, the transistor 24 is on and the transistor 25 is off. In this status at $t_1$, the voltage $V_{CE}$ of the transistor 1 between the collector terminal and the emitter terminal is a minimum value $V_{CE(SAT)}$ due to a saturation status thereof. When the overcurrent signal S is supplied to the base driving circuit 4, the base driving signal is changed to the OFF signal. The transistors 20, 21 and 23 are changed from off, on, and off to on off, and on respectively, almost immediately at the time $t_1$. It is delayed for the status of the transistor 23 to change due to the time constant circuit $TC_2$ as described before. Therefore, the changing of the statuses of the transistors 24 and 25 are delayed too. When the transistors 24 and 25 are changed from on and off to off and on, respectively, at a time $t_2$, the base current $I_B$ supplied by the transistor 24 is removed and the base current $I_B$ supplied by the time constant circuit $TC_1$ is provided. Therefore, the base current $I_B$ is reduced gradually and becomes zero at a time $t_4$. The length in time between the time $t_2$ and $t_4$ corresponds to the time constant of the time constant circuit $TC_1$. According to the reduction of the base current $I_B$, the collector current $I_C$ is reduced too. However, during the time between the times $t_2$ and $t_3$, the collector current $I_C$ does not reduce due to a carrier storage effect of the transistor 1. After the time $t_3$, until a time $t_5$, the reduction rate of the collector current $I_C$ corresponds to that of the base current $I_B$ of the transistor 1. At the time $t_5$, the transistor 1 has the off status by the reverse bias. The voltage $V_{CE}$ between the collector terminal and the emitter terminal of the transistor 1 is increased according to the collector current increasing during the time $t_1$ to $t_3$. During the time $t_3$ to $t_5$, the $V_{CE}$ increased up to peak value $V_P$ due to the inductance being in the leads 12, 13 and 14 and the differentiation of the collector current dI/dt. After the time $t_5$, the $V_{CE}$ becomes the voltage $V_D$ of the D.C. source.

In the embodiment of the present invention, since the differentiation of the base current $I_B$ is decided by the time constant circuit $TC_1$, it is possible to make it a small value. Therefore, the peak value $V_P$ of the voltage $V_{CE}$ is suppressed to a small value.

In the inverter operation, when the transistor 1 or 2 is changed by the base driving signal, the collector current $I_C$ may exceed the reference value $I_{Cref}$ under normal operation. Therefore, it is necessary to prevent the above protection operation for the overcurrent during the changing of the transistors 1 and 2 under normal operation. The interlock signal IS is given by the control circuit 3 for this reason. When the interlock signal IS is given, the transistor 26 is on. Then the terminals between the base terminal and the emitter terminal of the transistor 20 are shorted. This means that the transistor 20 does not become on by the overcurrent signal S. Therefore, the protection operation during normal operation of the inverter is prevented.

Figure 3:
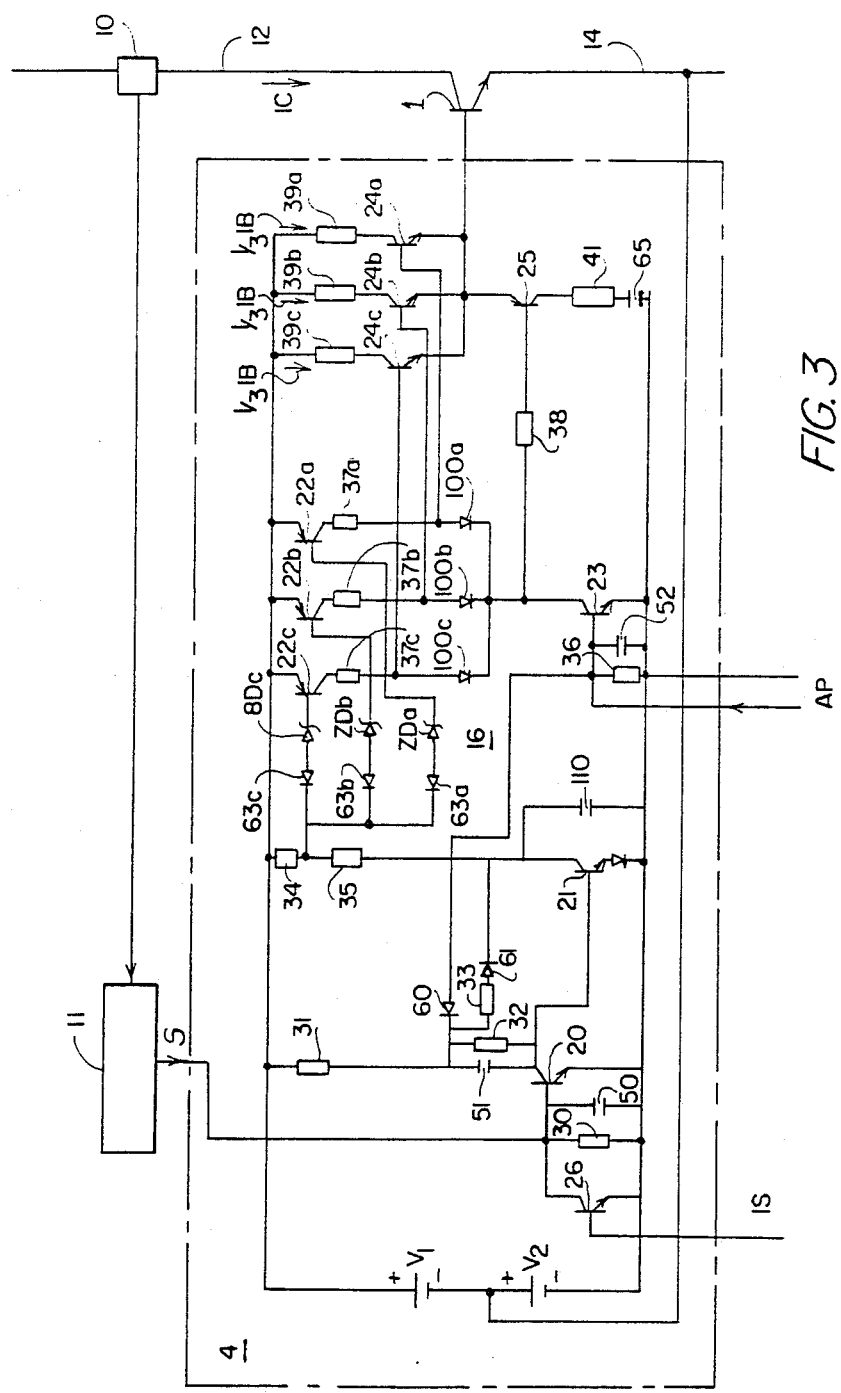
FIG. 3 shows another embodiment of the present invention.

FIG. 3 shows a base driving circuit of another embodiment of the present invention. The embodiment is essentially replaced the time constant circuit $TC_1$ to a time sequential control circuit 16 which is formed by Zener diodes $ZD_a$, $ZD_b$ and $ZD_c$ and a capacitor 110. The transistor 24 is divided to three transistors 24a, 24b and 24c to which resistors 39a, 39b and 39c having a resistance value of three times of the resistor 39 are connected, respectively. The transistor 22 is divided to three transistors 22a, 22b and 22c, each collector terminal of which is connected to the collector terminal of the transistor 23 through each series circuit of the resistors 37a, 37b and 37c and diodes 100a, 100b and 100c, respectively. The each base terminal of the transistors 24a, 24b and 24c is connected to each connecting point of the series circuits of the resistors and diodes respectively.

The each base terminal of the transistors 22a, 22b and 22c is connected to the connecting point of the resistor 34 and 35 through the each series circuit of the Zener diodes $ZD_a$, $ZD_b$ and $ZD_c$ and diodes 63a, 63b and 63c. The capacitor 110 is connected between the collector terminal of the transistor 21 and the lead connected to the minus terminal of the auxiliary DC source $V_2$. The each Zener voltage of the Zener diodes $ZD_a$, $ZD_b$ and $ZD_c$ is different and the Zener voltage of $ZD_a$ is largest, $ZD_b$ is middle and $ZD_c$ is smallest.

The other parts of the circuit are identical with that of the embodiment shown in FIG. 1.

Under normal operation and the transistor 1 is on and the transistor 21 is on. To be shorted the capacitor 110 by the transistor 21, all transistors 22a, 22b and 22c are on, all transistors 24a, 24b and 24c are on and the base current $I_B$ of the transistor 1 is supplied.

Figure 4:
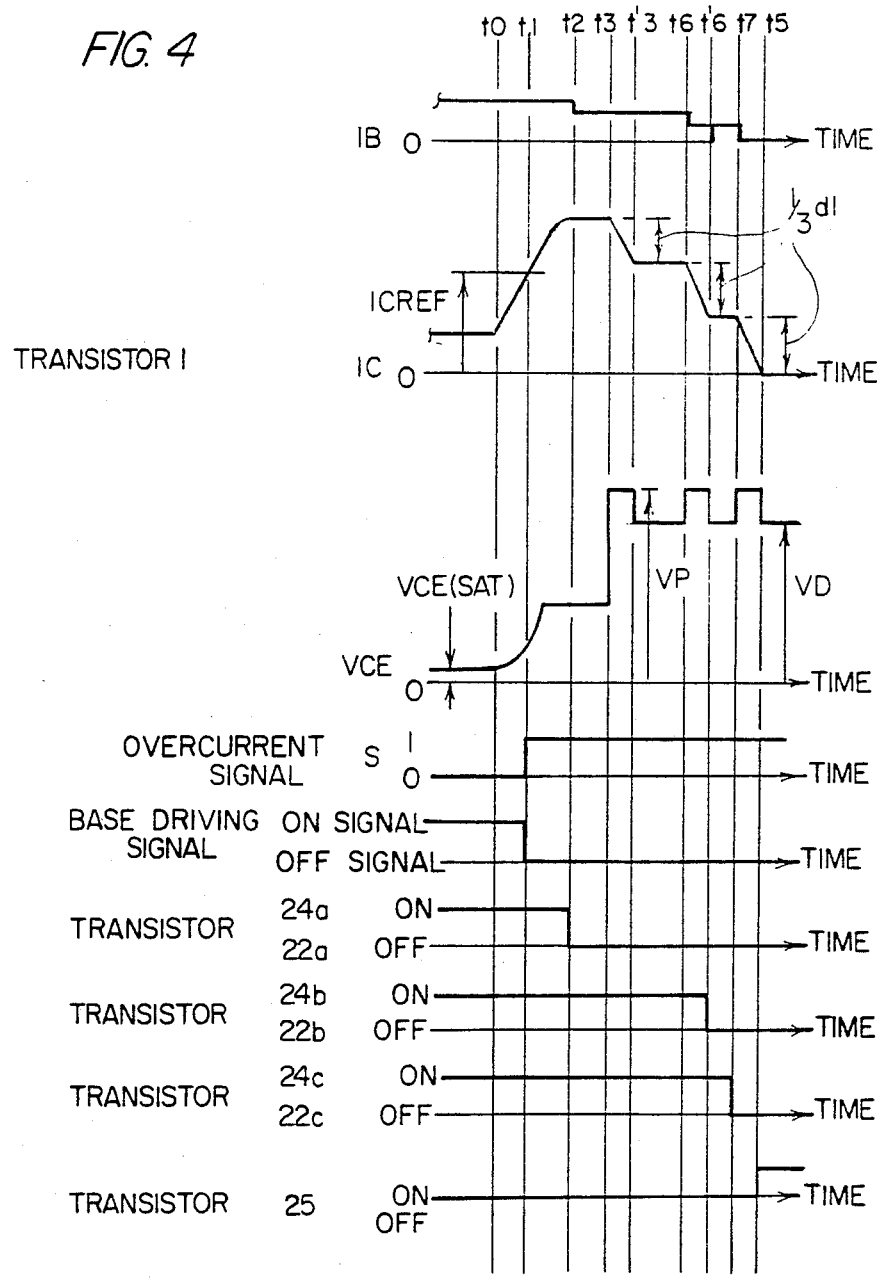
FIG. 4 shows some important wave forms of another embodiment of the present invention.

When the overcurrent signal S is supplied, the base driving signal is changed from the ON signal to the OFF signal at a time $t_1$, in FIG. 4, and the transistor 21 turns off, in accordance with the previously described FIG. 1. Then, the voltage of the capacitor 110 rise gradually according to a time constant of the resistances of the resistors 34 and 35 and the capacitance of the capacitor 110. As the voltage of capacitor 110 rises, the transistors 22a, 22b and 22c are sequentially changed from the on status to the off status, as shown in FIG. 4, as the Zener diodes $ZD_a$, $ZD_b$ and $ZD_c$ respectively upon current, and the transistors 24a, 24b and 24c are sequentially controlled to the off status, in order, respectively.

At a time $t_2$, the transistor 24a is turned off, then the base current $I_B$ is reduced by $\frac{1}{3}$ $I_B$. According to the reduction, the collector current $I_c$ reduces by $\frac{1}{3}$ dI between a time $t_3$ to $t_3'$. The reason why there is a delay time between the time $t_2$ and $t_3$ is the same as the embodiment of FIG. 1. At times $t_6$ and $t_7$, the transistors 24b and 24c are turned off status, respectively; and the collector current $I_c$ reduces by $\frac{1}{3}$ dI at times between the time $t_6$ and a time between $t_6'$ and the time $t_7$ and a time $t_5$. The reduction rate of the collector current $I_c$ is decided by the characteristics of the circuit passing the current $I_c$ and is larger than that of the embodiment of FIG. 1. However, the largeness of the reduction of the collector current $I_c$ is $\frac{1}{3}$ of the embodiment of FIG. 1. Therefore, the differentiation value in time of the collector current $I_c$ becomes a small value and the peak value $V_P$ applied to the transistor 1 is suppressed. At the time $t_5$, the transistor 25 is turned off.

We claim:

1. An inverter, comprising:
   at least one load current supplying transistor for each phase of the inverter;
   means for generating on and off signals according to a fixed order corresponding to the number of phases of the inverter and a fixed period in time;
   means for providing a base current for each of said transistors according to the on signals;
   means for detecting a current flowing in the series circuits;
   means for determining that the detected current exceeds a predetermined value and for producing a current exceeding signal; and
   separate delay means in addition to all of said means for reducing the base current with longer time than that decided by characteristics when said current exceeding signal is provided so that a changing rate in time of the collector current of the transistor is reduced over a period of time substantially longer than that decided by a characteristics of the transistor and load.

2. The inverter according to claim 1, wherein said means for reducing the base current includes a resistance and a capacitance in order to determine the changing rate in time.

3. The inverter according to claim 1, wherein said means for reducing the base current includes a sequence control circuit in order to determine the changing rate in time.

4. The inverter according to claim 1, comprising:
   means for nullifying the current exceeding signal, when the base driving signals are changed according to said means for generating.

5. A method for protecting a transistor inverter having a plurality of transistors, at least two of which are connected in series; the series circuit of the transistor being connected in parallel according to a number of phases of a load which is to be connected to said inverter, and to be connected in parallel with a D.C. power source; and each connecting point of the series circuit is to be provided as a connecting point for the load, comprising:
   generating on and off signals according to a fixed order corresponding to the number of phases and a fixed period in time;

providing a base current for each of said transistors according to the on signals;

detecting a current flowing in the series circuits;

determining that the detected current exceeds a predetermined value and producing a current exceeding signal;

reducing the base current with a predetermined changing rate in time when said current exceeding signal is provided so that a changing rate in time of the collector current of the transistor is reduced over a period of time substantially longer than that decided by a characteristics of the transistor and load.

6. Method for protecting transistor inverter according to claim 5, comprising:

invaliding the current exceeding signal when the base driving signals are changed according to said means for generating.

7. In an inverter having a base driving circuit for a transistor passing current to the load, with the base driver circuit having a detector for detecting an overcurrent through the transistor and feeding an overcurrent signal to means for reducing the base current of the transistor for preventing the transistor from being destroyed due to overcurrent, wherein the inductance in the circuit having the transistor in series with the load may produce an over voltage that will destroy the transistor when the base current is turned off with a changing rate of the inverter, the improvement comprising:

delay means in addition to the inverter for reducing the base current changing rate of the inverter upon detecting overcurrent so that the changing rate of the collector current of the transistor is reduced over a period of time substantially longer than that decided by the characteristics of the circuit having the transistor and load so that the transistor is protected from overvoltage.

* * * * *